(12) United States Patent
Shino et al.

(10) Patent No.: US 7,072,583 B2
(45) Date of Patent: Jul. 4, 2006

(54) OPTICAL COMMUNICATION METHOD AND APPARATUS

(75) Inventors: Kuninori Shino, Tokyo (JP);
Yoshinobu Kure, Kanagawa (JP);
Kazuyoshi Horie, Tokyo (JP); Youichi Toriumi, Tokyo (JP); Yoshifumi Masuda, Nara (JP); Kazuhito Nagura, Nara (JP)

(73) Assignees: Sony Corporation (JP); Sharp Kabushiki Kaisha (JP)

( * ) Notice: Subject to any disclaimer, the term of this patent is extended or adjusted under 35 U.S.C. 154(b) by 719 days.

(21) Appl. No.: 10/019,332

(22) PCT Filed: Apr. 25, 2001

(86) PCT No.: PCT/JP01/03584

§ 371 (c)(1),
(2), (4) Date: Jun. 21, 2002

(87) PCT Pub. No.: WO01/84751

PCT Pub. Date: Nov. 8, 2001

(65) Prior Publication Data

US 2003/0025958 A1 Feb. 6, 2003

(30) Foreign Application Priority Data

Apr. 28, 2000 (JP) .............................. 2000-129077

(51) Int. Cl.
*H04B 10/24* (2006.01)
*H04B 10/00* (2006.01)

(52) U.S. Cl. .......................... 398/41; 398/138; 398/139

(58) Field of Classification Search ................... 398/41
See application file for complete search history.

(56) References Cited

U.S. PATENT DOCUMENTS 5,432,874 A * 7/1995 Muraguchi ................... 385/24

FOREIGN PATENT DOCUMENTS

| JP | 5-91049 A | 4/1993 |
| JP | 5-268170 A | 10/1993 |
| JP | 8-234061 A | 9/1996 |
| JP | 8-234063 A | 9/1996 |
| JP | 10-242918 A | 9/1998 |
| JP | 11-237535 A | 8/1999 |
| JP | 11-352364 A | 12/1999 |

* cited by examiner

*Primary Examiner*—Jason Chan
*Assistant Examiner*—Danny Wai Lun Leung
(74) *Attorney, Agent, or Firm*—Lerner, David, Littenberg, Krumholz & Mentlik, LLP

(57) ABSTRACT

An optical communication apparatus in which bidirectional communication may be made over a sole optical fiber. A light emitting device (132) radiates light through an optical system (133) to an optical fiber (76). The light transmitted from the optical fiber (76) is received over optical system (133) by a light receiving device (136). In the optical system (133), such a relationship $S-2QN \geq M > S/2Q-N$ is set, where M is the light volume of the stray light emitted, Q is the value of a Q-value representing the communication quality as required, S is the light volume of a received signal from a communication partner and N is the sum total of the Gaussian noise.

6 Claims, 12 Drawing Sheets

AFTER CURRENT-VOLTAGE CONVERSION
WITH 10% STRAY LIGHT

AFTER CURRENT-VOLTAGE CONVERSION
WITH 30% STRAY LIGHT

OPTICAL COMMUNICATION METHOD AND APPARATUS

TECHNICAL FIELD

This invention relates to an optical communication method and apparatus and, more particularly, to a method and apparatus for enabling bidirectional communication over a sole optical fiber.

BACKGROUND ART

Conventionally, the IEEE 1394 high speed serial bus, referred to below as 1394 bus, was used. By employing the 1394 bus, a plural number of electronic equipment in a household can be interconnected to form a household network.

Should a routine electrical cable be used as this 1394 bus, attenuation becomes severe such that limitations are imposed on the usable range. The standards for an electrical cable provide that the longest transmission range be 4.5 m. In such case, even interconnecting an equipment mounted on a wall of a room about 5.4 m$^2$ in size to another equipment mounted on the opposite wall of the same room along the wall is rendered difficult.

If in transmitting/receiving data using an optical fiber, a preset bit error rate (BER) is to be realized, it is necessary to provide for a preset signal to noise ratio (S/N ratio). When it is checked whether or not a preset bit error rate (S/N ratio) can be realized using an optical fiber, a system shown for example, in FIG. 1 is usually presupposed. In this system, if the volume of light transmitted using the optical fiber is at a level H or at a level L, such states are verified to be a logical level H and a logical level L, respectively. In actuality, the amount of light received is changed analogically, so that, with a median decision level between the level H and the level L (H+L)/2 being a decision level D, the state of the volume of the received light being larger than D and the state of the volume of the received light being smaller than D are verified to be the logical 1 and the logical 0, respectively.

Conventionally, a bit error rate BER was calculated from the following equations, assuming that a Gaussian noise was superposed on each of the levels H and L:

$$BER = \frac{1}{2}\int_{-\infty}^{D} \frac{1}{\sigma\sqrt{2\pi}} \exp\left(-\frac{(H-x)^2}{2\sigma^2}\right)dx +$$
$$\frac{1}{2}\int_{D}^{\infty} \frac{1}{\sigma\sqrt{2\pi}} \exp\left(-\frac{(x-L)^2}{2\sigma^2}\right)dx$$
$$= \int_{D}^{\infty} \frac{1}{\sigma\sqrt{2\pi}} \exp\left(-\frac{(x-L)^2}{2\sigma^2}\right)dx$$
$$= \int_{\frac{H-L}{2\sigma}}^{\infty} \frac{1}{\sqrt{2\pi}} \exp\left(-\frac{y^2}{2}\right)dy \quad [y=(x-L)/\sigma]$$
$$= \frac{1}{\sqrt{2\pi}} \int_{Q}^{\infty} \exp\left(-\frac{y^2}{2}\right)dy \quad [Q=(H-L)/(2\sigma)]$$

In the above equations, BER is calculated as a ratio to the entire area of an area where the skirts of the Gaussian distribution of the level H overlap with those of the level L.

If, in the above equations, H−L is a signal level S and the noise is 6, the S/N ratio is related with the value Q by the following equation:

S/N ratio=2Q

The relation between the bit error rate BE and the Q value is as shown in FIG. 1, wherein the ordinate and the abscissa denote BER and the Q-value, respectively.

In the 1394 bus, 1E−12 (=1×10·12) is required for the bit error rate. The corresponding Q-value is approximately 7 from FIG. 2. If Q=7 is re-calculated as S/N ratio, the result is 14, that is 11.5 dB. In many other communication systems, 1E−9 is required for the bit error rate. The corresponding Q value is 6, with the S/N ratio being 12, that is 10.8 dB.

Up to now, it was retained to be difficult to realize such bit error rate BER=1E−12 on a sole optical fiber by full duplex communication. The full duplex communication means the communication employing substantially the same wavelength for both the transmitting and receiving sides to effect light propagation for transmission and that for reception simultaneously.

For example, as shown in FIG. 3, the light of a preset wavelength is generated from a light transmitting device 2 of an equipment 1 so as to be transmitted over an optical fiber 21 to an equipment 2 for reception by a light receiving device 13 of the equipment 2. On the other hand, a light emitting device 12 of the equipment 2 emits light of substantially the same wavelength as that of the light generated by the light transmitting device 2 and transmitted over the optical fiber 21 for reception by a light receiving device 3 of the equipment 1.

If, on the side equipment 1, the light receiving device 3 receives only the light generated by the light emitting device 12 of the equipment 2, the equipment 1 is able to perform transmission/reception substantially simultaneously as the equipment 2.

In actuality, the light generated by the light emitting device 12 of the equipment 2 may leak directly into the light receiving device 3, may be reflected by an end face towards the side equipment 1 of the optical fiber 21 (proximate end face) so as to be received by the light receiving device 3, or may be reflected by an end face towards the equipment 2 of the optical fiber 21 (distal end face) so as to be received by the light receiving device 3. That is, the light receiving device 3 receives the return light of the light generated by the light emitting device 12 (stray light), in addition to the light generated by the light emitting device 12. This stray light was thought to be a noise component. The result is that, if this stray light is present in an amount of 10% of the signal amount, the S/N ratio is 10 (=1/0.1). If calculated as Q value, the S/N ratio is 5 (10/2). As may be seen from FIG. 2, the bit error rate for realizing Q=5 is approximately 1E−6.5. That is, should there be stray light of 10%, it is difficult to realize the bit error rate of 1E−9 required in many communication systems, to say nothing of the bit error rate of 1E−12 as required for a 1394 bus.

In view of the above-mentioned facts, a proposal has been made for providing an optical fiber 21A for transmission and an optical fiber 21B for reception, looking from the equipment 1, to effect transmission and reception simultaneously. This structure necessitates basically two optical fibers.

Also, a proposal has also been made for interconnecting the equipment 1 and 2 over a sole optical fiber 21 and for providing an optical system 31 or 41 for each of the equipment 1 and 2 to effect time-divisional communication.

The optical system 31 is basically configured as shown in FIG. 6. The opposite side optical system 41 is similarly configured, as shown in FIG. 6. This optical system 31 includes a prism 52 on a substrate 51. The light radiated from the light emitting device 2 is reflected by a surface 52A of the prism 52 and introduced through a lens 53 into the inside of the optical fiber 21 via end face 21A thereof so as to be transmitted to the side equipment 2. The light transmitted from the equipment 2 is radiated from the end face 21A of the optical fiber 21 to fall on an end face 52A of the prism 52 through lens 53 and is transmitted through the prism to fall on the light receiving device 3 formed on the substrate 51.

The optical systems 31, 41, configured as described above, separate the light for transmission, radiated from the light emitting device 12 and the light for reception transmitted from the optical fiber 21, by the prism 52.

However, pair of light radiated from the light emitting device 12 is not reflected from the surface 52A of the prism 52, but is introduced into the inside of the prism 52, so as to be received by the light receiving device 3. The processing for transmission and that for reception are carried out time-divisionally, as shown in the flowcharts of FIGS. 7 and 8.

That is, at step S1, the equipment 1 at step S1 verifies whether or not there is data for transmission. If there is no data for transmission, processing transfers to step S2 to check whether or not a use request signal for a line (optical fiber 21) has been received from the equipment 2. If there is no line use request signal from the equipment 2, processing reverts to step S1 to repeat the subsequent processing.

If it is verified at step S2 that the line use request signal has been received from the equipment, processing transfers to step S3 where the equipment 1 sets the reception mode. At step S4, it is verified whether or not a signal is being received from the equipment 2. That is, it is checked whether or not the line use request signal is being still received. If the signal is being received, waiting state is set until the signal ceases to be received. When the signal ceases to be received, processing transfers to step S5 where the equipment 1 advises the equipment 2 of the effect of setting of the reception mode.

If this notification is made, data is transmitted from the equipment 2, as will be explained subsequently. Then, the waiting mode is set at step S6 until data is received. On reception of the data, it is stored e.g., in a memory at step S7. At step S8, it is verified whether or not a data end signal is received and, if no signal has been received, processing reverts to step S6 to repeat subsequent steps.

If it is verified that the data end signal has been received at step S8, processing transfers to step S9 where the equipment 1 cancels the reception mode to revert to step S1 to repeat the subsequent steps.

If it is verified at step S1 that transmission data exist, processing transfers to step S10 where the equipment 1 outputs a line use request signal to the equipment 2. At step S11, the equipment 1 verifies whether or not reception mode setting notification has been received from the equipment 2. If the reception mode setting notification has been received, processing transfers to step S12 where the equipment 1 sets the transmission mode. At step S13, the equipment 1 sends data and, at step S14, it verifies whether or not data transmission has come to a close. If data transmission has come to a close, processing reverts to step S13 and, if otherwise, the processing reverts to step S13 to repeat subsequent steps.

If it is verified at step S14 that data transmission has come to a close, processing transfers to step S15 where the equipment outputs a data end signal to the equipment 2. At step S16, the equipment 1 cancels the transmission mode. Then, processing reverts to step S1 to repeat subsequent steps.

If it is verified at step S11 that the reception mode setting notification has not been received from the equipment 2, it may be conjectured that, at a timing of outputting the line use request signal at step S10 from the equipment 1 to the equipment 2, a line use request signal is also issued from the equipment 1, such that the two line use request signals overlap with each other with the result the equipment 2 has failed to receive the line use request signal output by the equipment 1. Thus, in such case, processing transfers to step S17 where the equipment 2 verifies whether or not the line use request signal has again been received. If the line use request signal has not been received, processing transfers to step S18 to verify whether or not a preset random time has elapsed since the outputting of the line use request signal. If this preset random time has not elapsed processing reverts to step S17 to execute subsequent steps repeatedly.

If it is verified at step S18 that the preset random time has elapsed, processing reverts to step S1 to execute subsequent steps repeatedly.

In similar manner, if the equipment 2 has output a line use request signal to the equipment 1, but no reception mode setting notification is sent from the equipment 1, the equipment 2 executes the processing of queuing until a preset random time elapses. In general, this preset random time is different from the preset random time as set for the equipment 1. If the preset time for the equipment 1 is longer than that for the equipment 2, the equipment 2 again sends a line use request signal when the equipment is at a standby state. In such case, the line use request signal is deemed to have been received at step S17, so that processing transfers to step S3 to execute the processing similar to that described above.

That is, in the present instance, transmission processing is initiated independently from both the equipment 1 and 2 and, failing a proper response from the counterpart side, the random standby state is set for both equipment to permit similar processing to be re-executed. Since this random time for the two equipment is usually different, the equipment with the shorter time setting is the first to transmit data.

Thus, in the conventional system transmitting or receiving data over a sole optical fiber, data is transmitted/received time-divisionally. As a result, a technical problem is presented that each equipment is unable to transmit data reliably at a preset timing.

DISCLOSURE OF THE INVENTION

It is therefore an object of the present invention to provide an optical communication method and apparatus whereby data can be reliably transmitted/received at an optional timing using a sole optical fiber.

For accomplishing the above object, the present invention provides an optical communication apparatus in which light for transmission and light for receipt are propagated simultaneously over a sole cable to effect bidirectional communication, including light emitting means for emitting the light for transmission, light receipt means for receiving the light for receipt and light guide means for guiding the light for transmission over the cable and for guiding the light for receipt to the light receipt means, wherein the value of a light volume M of stray light generated with respect to the light receipt means is set to satisfy the following relationship:

$$S-2QN \geq M > S/2Q-N$$

where Q is the value of a Q-value representing the communication quality as required, S is the light volume of a received signal from a communication partner and N is the sum total of the Gaussian noise.

The ratio S/M, where S is the light volume of the received signal and M is the light volume of the stray light may be set to 7% to 30%. The transmission speed in the optical communication may be not lower than 100 Mbps.

The cable may be a plastic optical fiber.

The sum of light volumes of the reflected light from the communication partner may be 0.7% to 3.0% of the volume of the received light in the communication partner.

The present invention also provides an optical communication method by an optical communication apparatus including light emitting means for emitting the light for transmission, light receipt means for receiving the light for receipt and light guide means for guiding the light for transmission over the cable and for guiding the light for receipt to the light receipt means, the light for transmission and the light for receipt of substantially the same wavelength being propagated substantially simultaneously by a sole cable to effect bidirectional communication, wherein the value of a light volume M of stray light generated with respect to the light receipt means is set to satisfy the following relationship:

$$S-2QN \geq M > S/2Q-N$$

where Q is the value of a Q-value representing the communication quality as required, S is the light volume of a received signal from a communication partner and N is the sum total of the Gaussian noise.

The present invention also provides an optical communication apparatus in which the light for transmission and light for receipt of substantially the same wavelength are propagated simultaneously over a sole cable to effect bidirectional communication, including light emitting means for emitting the light for transmission, light receipt means for receiving the light for receipt and light guide means for guiding the light for transmission over the cable and for guiding the light for receipt to the light receipt means, and controlling means for controlling the light emitting means and the light receipt means, the controlling means allowing for processing of a signal corresponding to the light for receipt received by the light receipt means in a state in which the light for transmission is emitted by the light emitting means and propagated over the cable, the controlling means allowing for processing for transmission of a signal by the light for transmission emitted by the light emitting means in a state in which the light for receipt propagated over the cable is being received by the light receipt means.

The present invention also provides an optical communication method for an optical communication apparatus including light emitting means for emitting the light for transmission, light receipt means for receiving the light for receipt and light guide means for guiding the light for transmission to the cable and for guiding the light for receipt to the light receipt means, in which light for transmission and light for receipt of substantially the same wavelength are propagated simultaneously over a sole cable to effect bidirectional communication, in which the optical communication method includes allowing for processing of a signal corresponding to the light for receipt received by the light receipt means in a state in which the light for transmission is emitted by the light emitting means and propagated over the cable, and allowing for processing for transmission of a signal by the light for transmission emitted by the light emitting means in a state in which the light for receipt propagated over the cable is being received by the light receipt means.

In the method and apparatus for optical communication, according to the present invention, processing of a signal corresponding to the light for receipt as received is allowed in a state in which light for transmission is radiated and propagated over a cable, while processing for transmission of the signal by the light for transmission emitted is allowed in a state in which the light for receipt propagated over the cable is received.

Other objects, features and advantages of the present invention will become more apparent from reading the embodiments of the present invention as shown in the drawings.

BEST MODE FOR CARRYING OUT THE INVENTION

Figure 9:
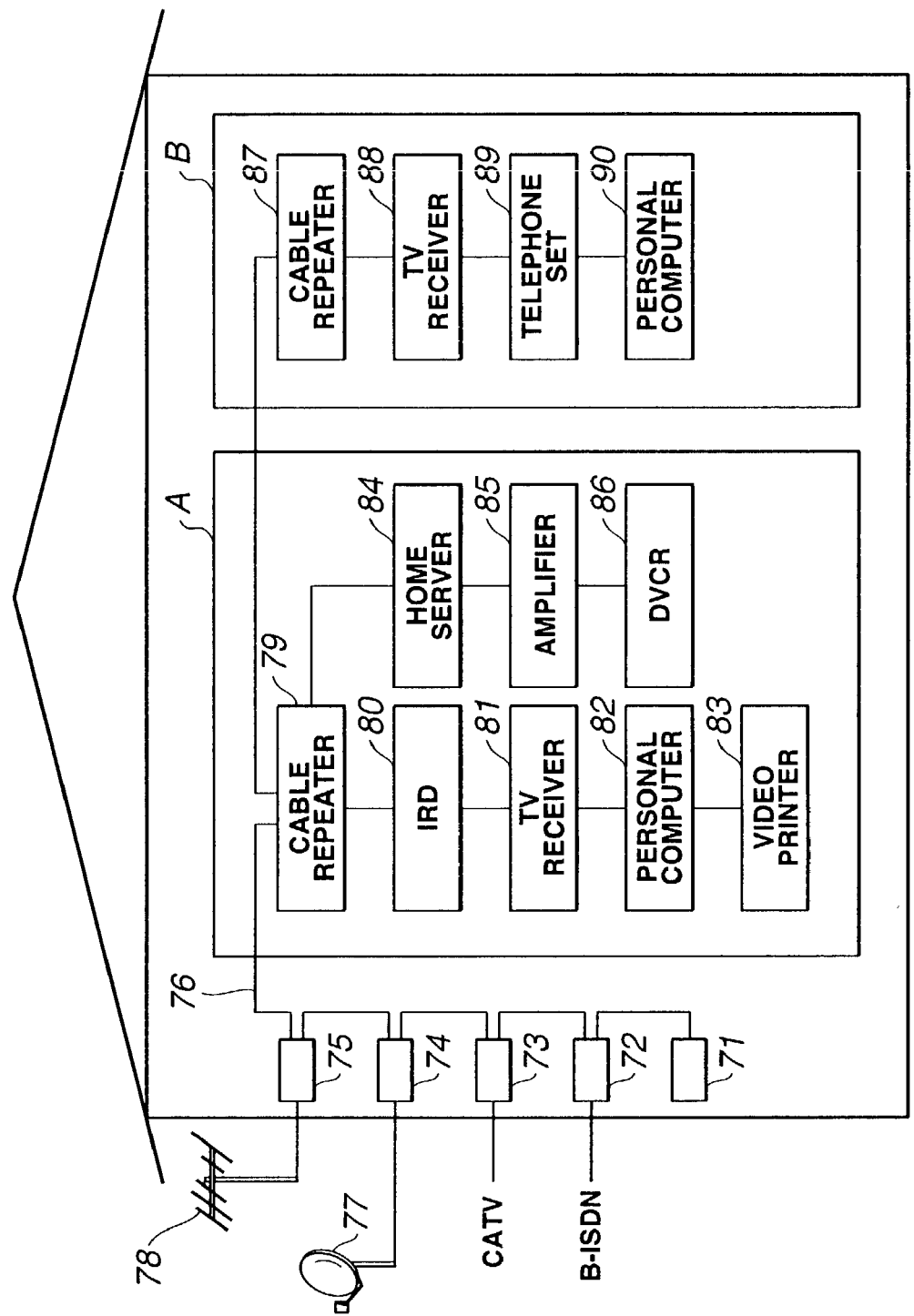
FIG. 9 illustrates the structure of a 1394 bus system embodying the present invention.

FIG. 9 shows an illustrative structure of a bus system embodying the present invention. In the arrangement, shown in FIG. 9, terminals 71 to 75 and electronic equipment in rooms A and B are interconnected over a plastic optical fiber 76.

To the terminals 72, 73, a network of B_ISDN and a network of CATV are connected, respectively. To the terminal 74 is connected a parabola antenna 77 for receiving electrical waves transmitted over a broadcast satellite or a communication satellite. To the terminal 75 is connected an antenna 78 for receiving electrical waves of television broadcast of ground waves.

In the room A, a cable repeater 79 is mounted and connected to a plastic optical fiber 76. To this cable repeater 79, an IRD 80, a television receiver 81, a personal computer 82 and a video printer 83 are connected over the connected plastic optical fiber 76, and a home server 84, an amplifier 85 and a DVCR 86 are also connected.

To a cable repeater 87 of the room B is connected the plastic optical fiber 76. To the cable repeater 87, a television receiver 88, a telephone set 89 and a personal computer 90 are also connected over this plastic optical fiber 76.

Figure 10:
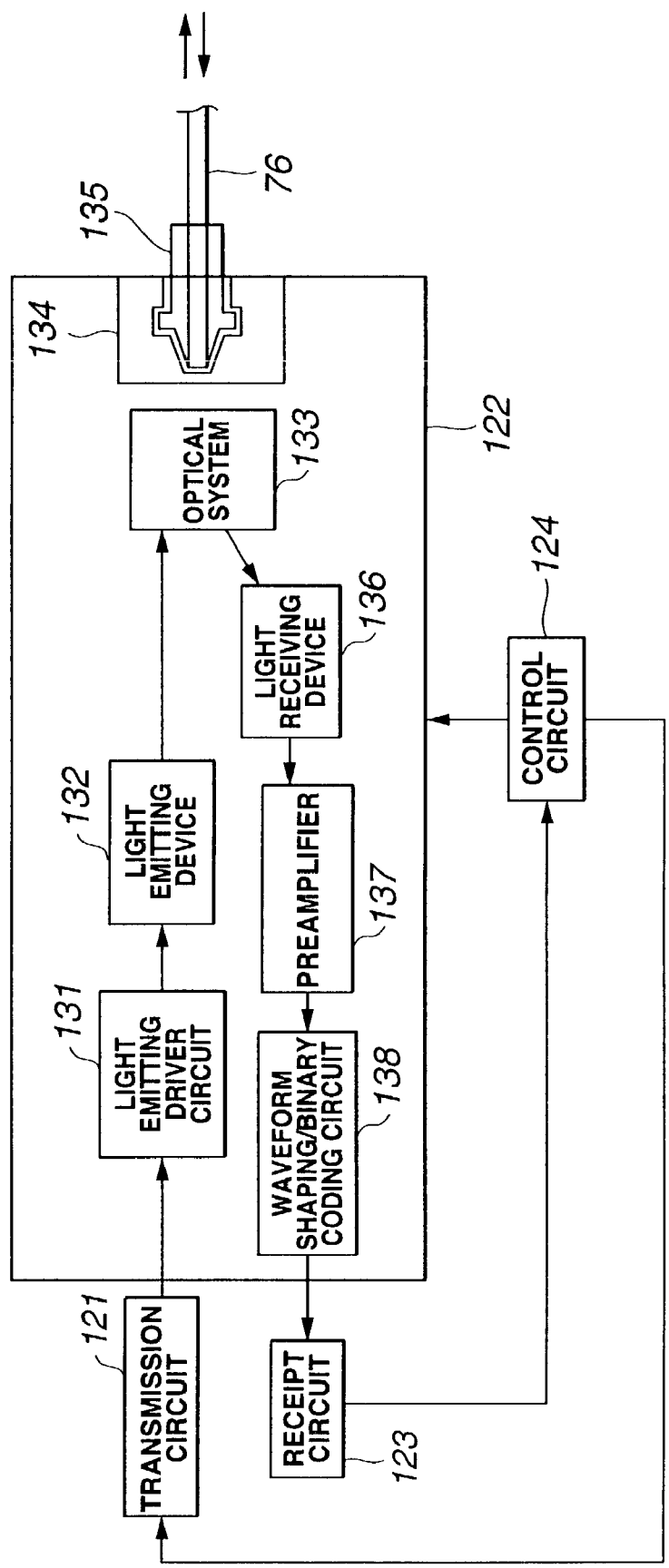
FIG. 10 shows an illustrative structure of an interface owned by each device shown in FIG. 9.

The equipment and terminals, connected to the plastic optical fiber 76, which will be hereinafter referred as an optical fiber 76, are provided with a built-in interface, configured as shown in FIG. 10, for executing optical communication over the optical fiber 76.

The end of the optical fiber 76 is connected to a plug 135 mounted in a receptacle 134. An optical system 133 is mounted facing the receptacle 34. The light propagated through the inside of the optical fiber 76 falls on the optical system 133 through plug 135 and receptacle 134 so as to be supplied from the optical system 133 to a light receiving device 136. The electrical signals corresponding to the amount of received light, output by the light receiving device 136, are converted by a preamplifier 137 from the electrical current to an electrical voltage. A waveform shaping/binary coding circuit 138 waveform shapes and binary encodes the voltage signals supplied from the preamplifier 137 to output the resulting voltage signals to a receipt circuit 123.

The transmission signal, output by a transmission circuit 121, are input to a light emitting driver circuit 131 of a transceiver circuit 122. The light emitting driver circuit 131 is responsive to an input signal to drive a light emitting device 132. The light emitting device 132 is responsive to the input signal to emit light, which then is routed through receptacle 134 and plug 135 to the optical fiber 76 and thence propagated to other equipment through the inside of the optical fiber 76.

A control circuit 124, comprised of e.g., a micro-computer, captures and processes data received by the receipt circuit 123 to send the processed transmission data to a transmission circuit 121. The control circuit 124 controls the transceiver circuit 122 in cooperation with the transmission circuit 121 and the receipt circuit 123 to control the transmission/reception operations.

Figure 11:
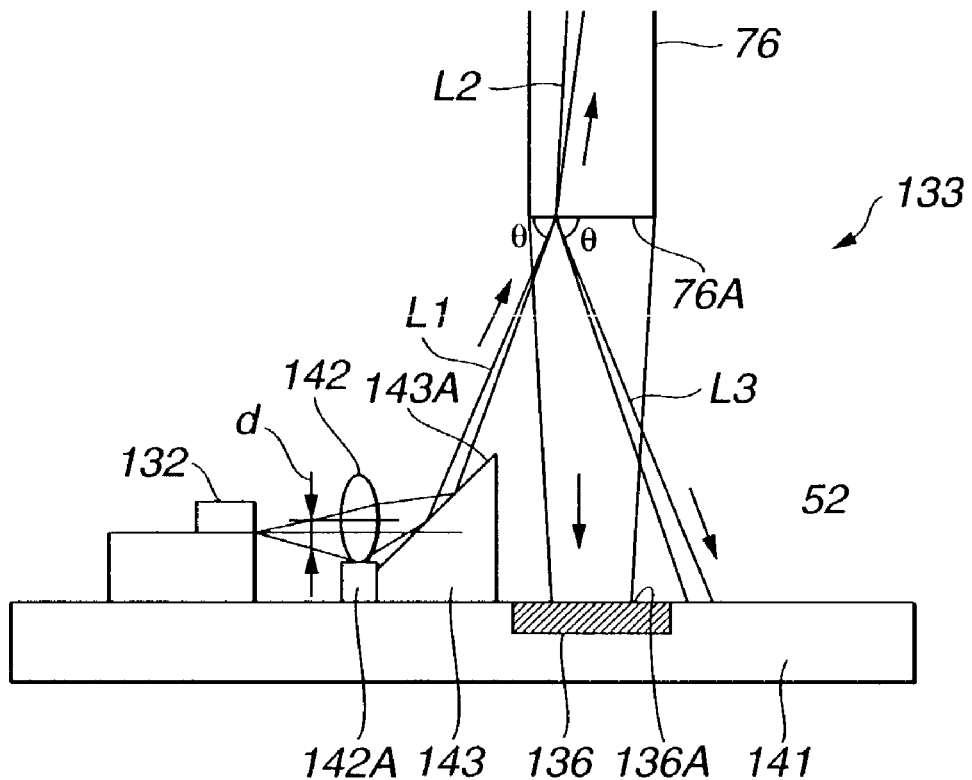
FIG. 11 shows an illustrative structure of an optical system shown in FIG. 10.

FIG. 11 shows an illustrative structure of the optical system 133. The light radiated from the light emitting device 132, such as a laser diode or an LED falls on a coupling lens 142 mounted on a base 142A provided on a semiconductor substrate 141. The optical axis of the coupling lens 142 is offset a distance d from the center of strength of light emitted by the light emitting device 132. The result is that the traveling path of the center of intensity of light radiated from the light emitting device 132 (main light beam) is bent upwards in FIG. 11 and is further totally reflected by a total reflection surface 143A of a light path raising mirror 143 mounted on the semiconductor substrate 141 so as to fall as light L1 on an end face 76A of the optical fiber 76 at an angle θ. The light L1 incident on the end face 76A is introduced into the bulk of the optical fiber 76 for propagation towards other equipment.

A part of the light L1, reflected by the end face 76A of the optical fiber 76 is illuminated as light L3 on the semiconductor substrate 141. The light receiving device 136 formed e.g., by a photodiode, is mounted at such a position on which light L3 is not incident and also on which the light transmitted from another equipment and radiated from the end face 76A of the optical fiber 76 is incident. As a result, the light receiving device 136 receives light from other equipment, but does not receive the light L3, as stray light, reflected by the end face 76A.

This effect can be realized by selecting the angle of the end face 76A of the optical fiber 76 or the degree of convergence (effective NA) of the light L3 to preset values.

The designing method for realizing a desired bit error rate BER in such optical system 133 is now explained.

Figure 12:
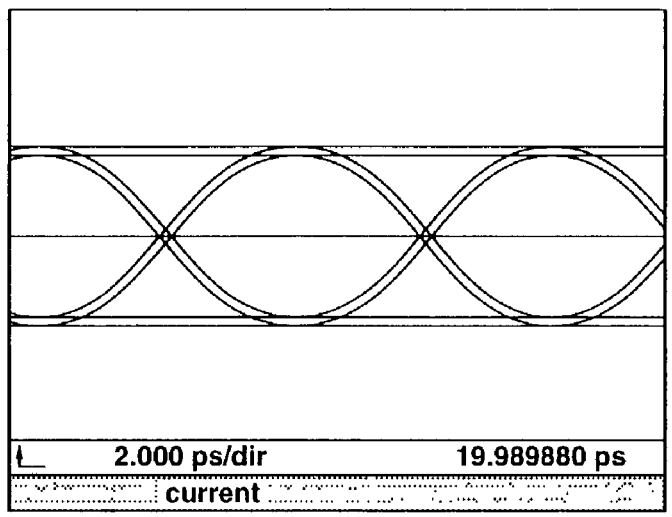
FIG. 12 shows an instance of the outputting of a light receiving device with the amount of stray light of 10%.
Figure 13:
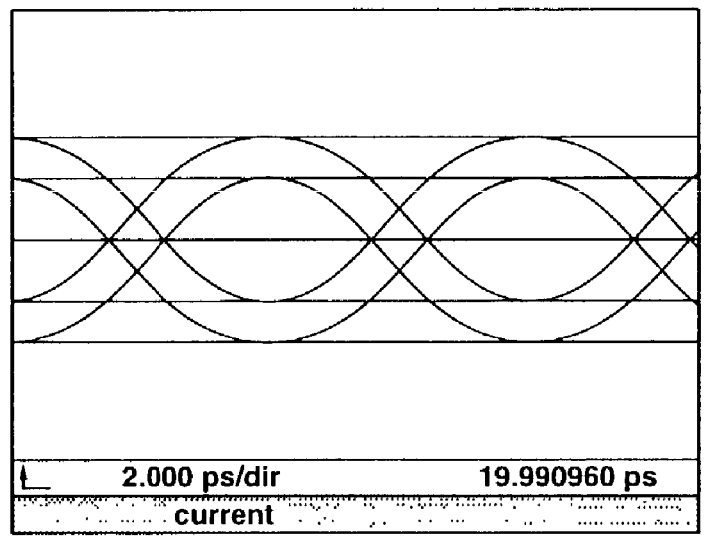
FIG. 13 shows an instance of the outputting of a light receiving device with the amount of stray light of 30%.

In the present invention, stray light is not thought of as a noise component in the Gaussian distribution, but is thought of as signal deterioration. That is, the waveform of a signal following current-to-voltage conversion by the preamplifier 137 of the output of the light receiving device 136 in case the amount of the stray light is 10% (see FIG. 12) and 30% (see FIG. 13) is as shown in FIGS. 12 and 13. As may be seen from these figures, the stray light components are thought of as existing stationarily in a certain proportion with respect to signals but not exhibiting so-called Gaussian distribution to gradually deteriorate the signal over a wide range. This may be understood from the fact that the eye pattern of FIGS. 12 and 13 is not blurred out in its entirety but simply become unclear only in an area lying outside a preset contour, with the inside of the contour remaining clear.

Figure 14:
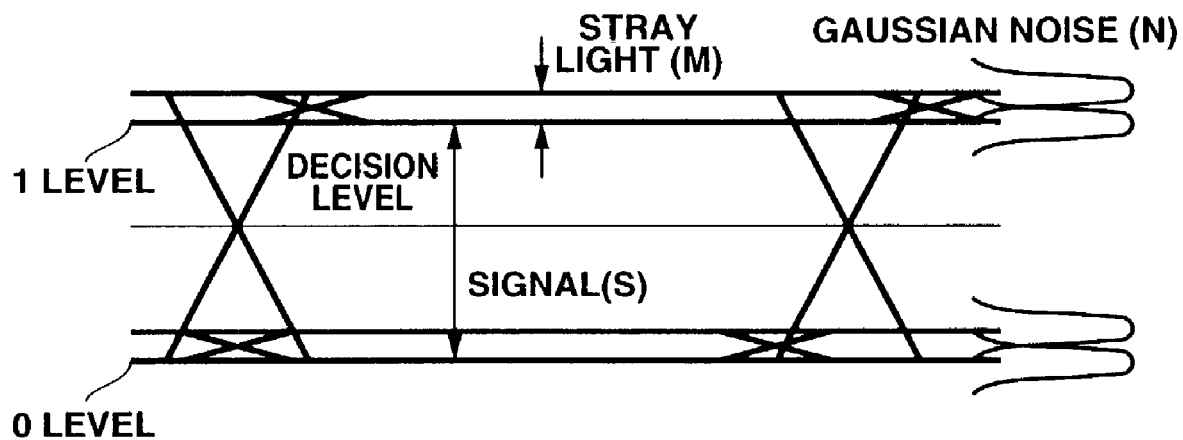
FIG. 14 illustrates the concept of stray light in the present invention.

That is, the stray light in the present invention exists as components increasing the levels of logical 0 and 1 by preset levels, as shown in FIG. 14. The noise exhibiting the Gaussian distribution exist respectively for the logical levels of 1 and 0 or relative to the stray light M.

The foregoing may be explained using a mathematical equation as follows: Assume that the volume of the signal light is S, the light volume of the stray light is M and the noise component undergoing the Gaussian noise such as light shot noise is N. Since the amount of stray light was hitherto deemed to be a noise, the S/N ratio was found by the following equation:

$$S/N \text{ ratio} = S/(N+M)$$

In the present invention, since the stray light is grasped not as a noise but as signal deterioration, the S/N ratio is represented by the following equation:

$$S/N \text{ ratio} = (S-M)/N.$$

Figure 1:
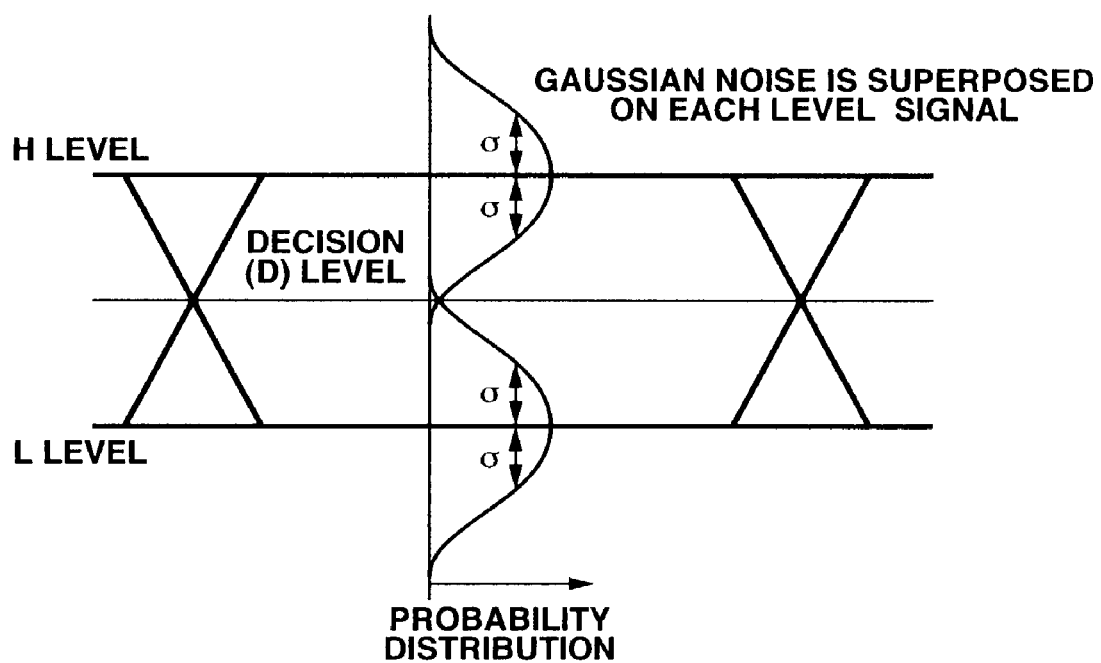
FIG. 1 is a conceptual view for illustrating stray light in a conventional optical communication system.
Figure 2:
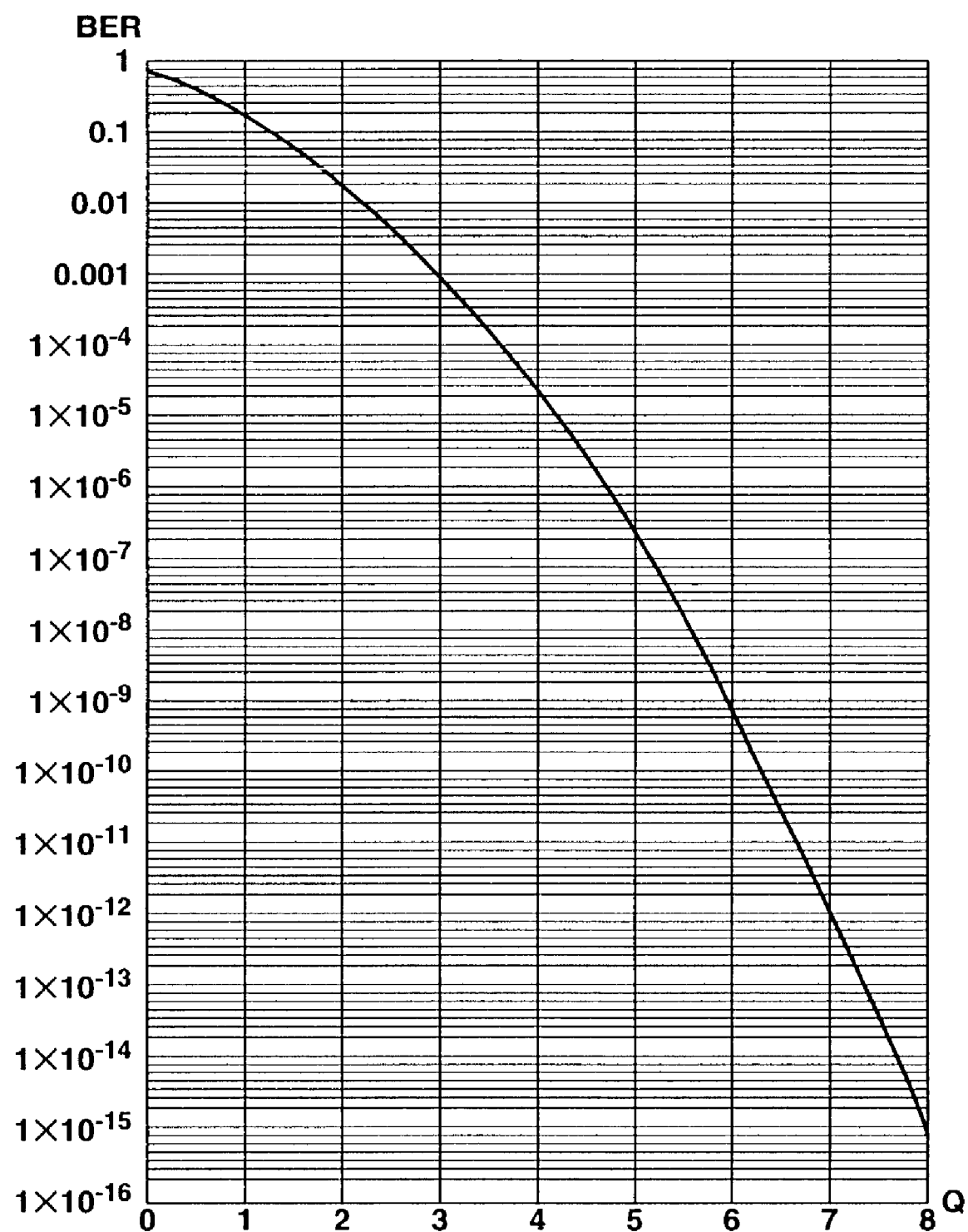
FIG. 2 is a graph showing the relation between the bit error rate and a Q-value.
Figure 3:
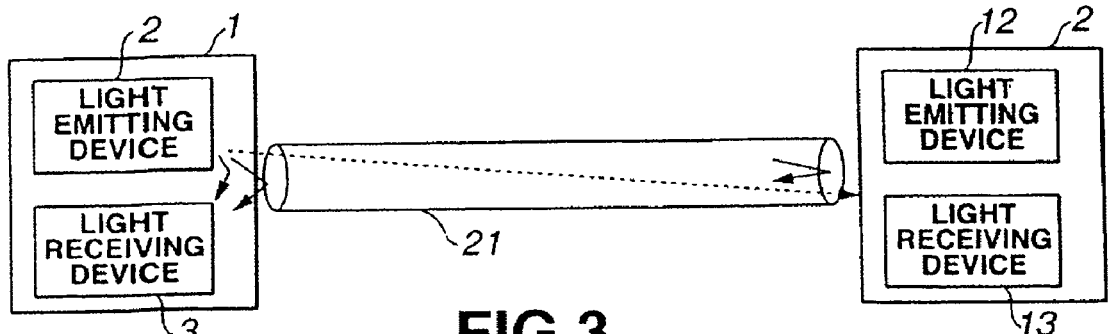
FIG. 3 illustrates the stray light in an optical fiber.
Figure 4:
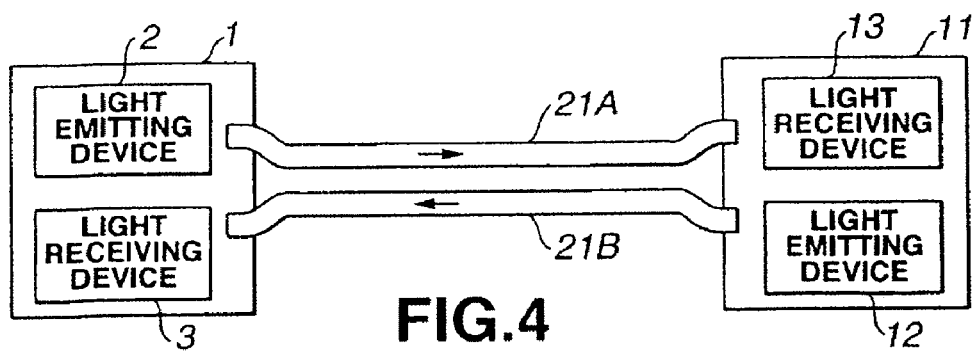
FIG. 4 shows an illustrative structure of a conventional optical communication system.
Figure 5:
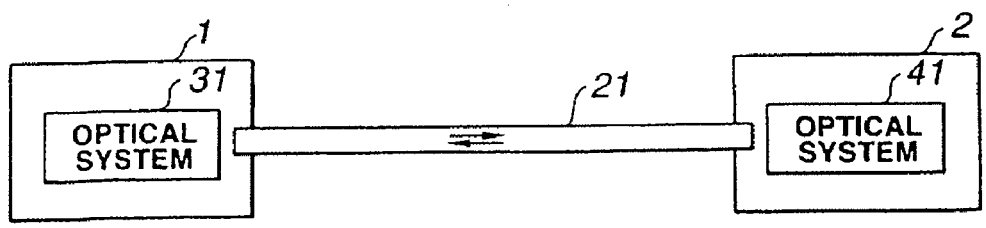
FIG. 5 shows another illustrative structure of a conventional optical communication system.
Figure 6:
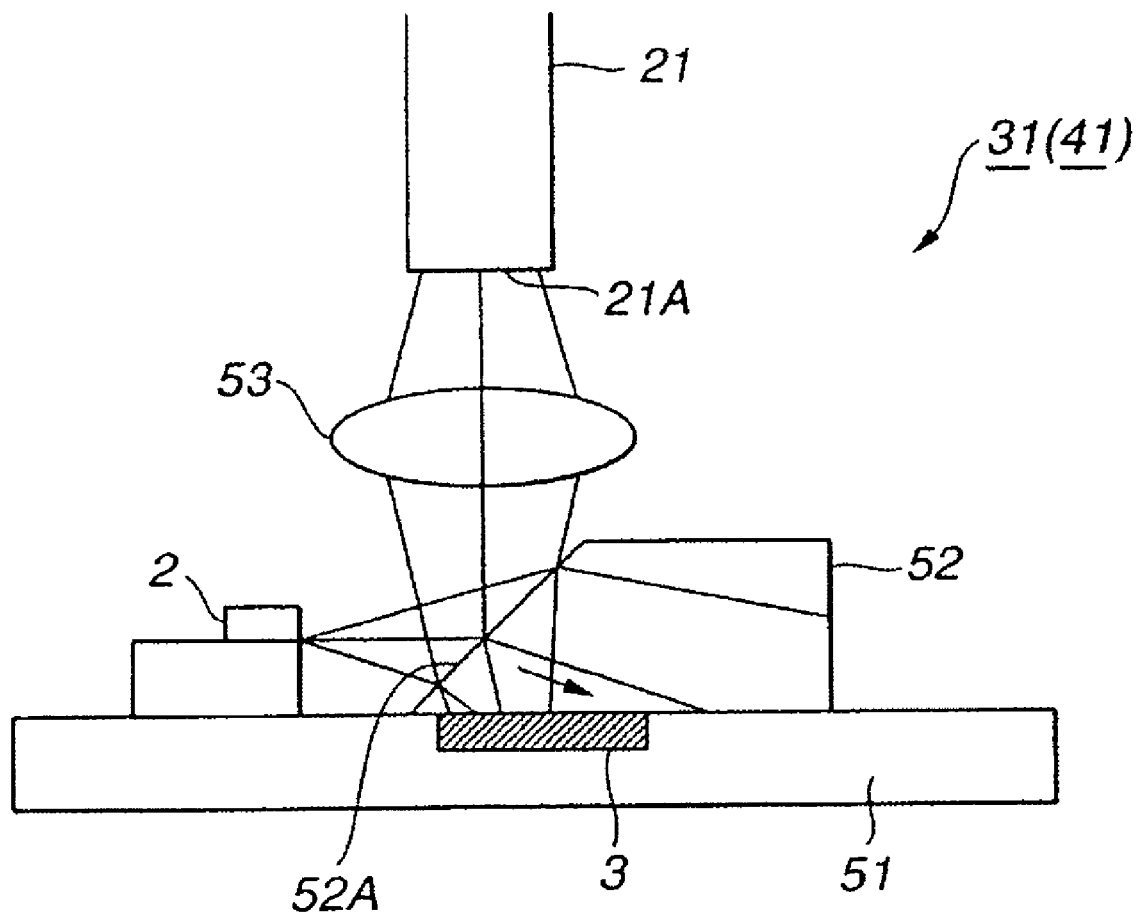
FIG. 6 shows an illustrative structure of an optical system forming the optical communication system shown in FIG. 5.
Figure 7:
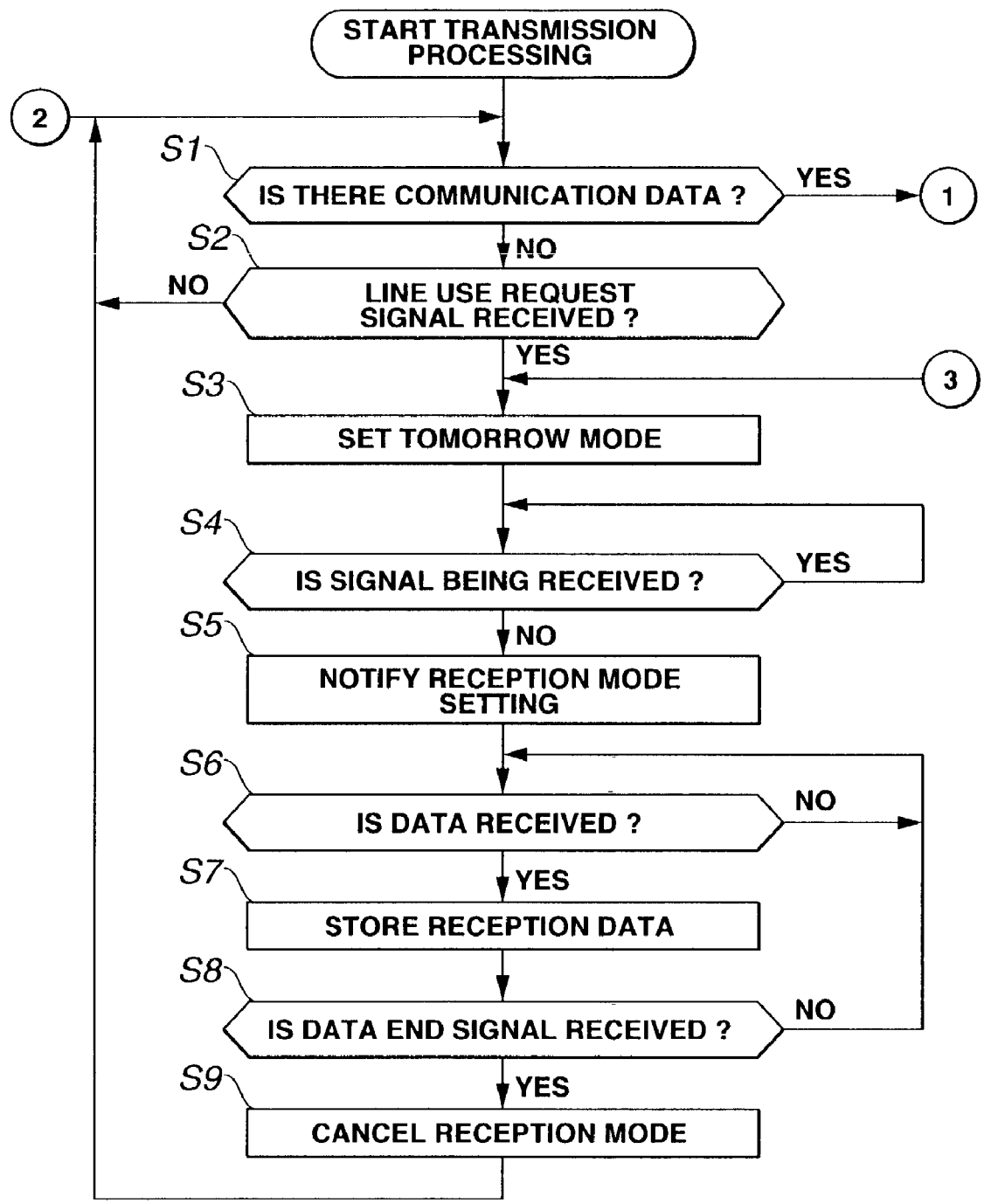
FIG. 7 is a flowchart for illustrating the communication processing in the optical communication system shown in FIG. 5.
Figure 8:
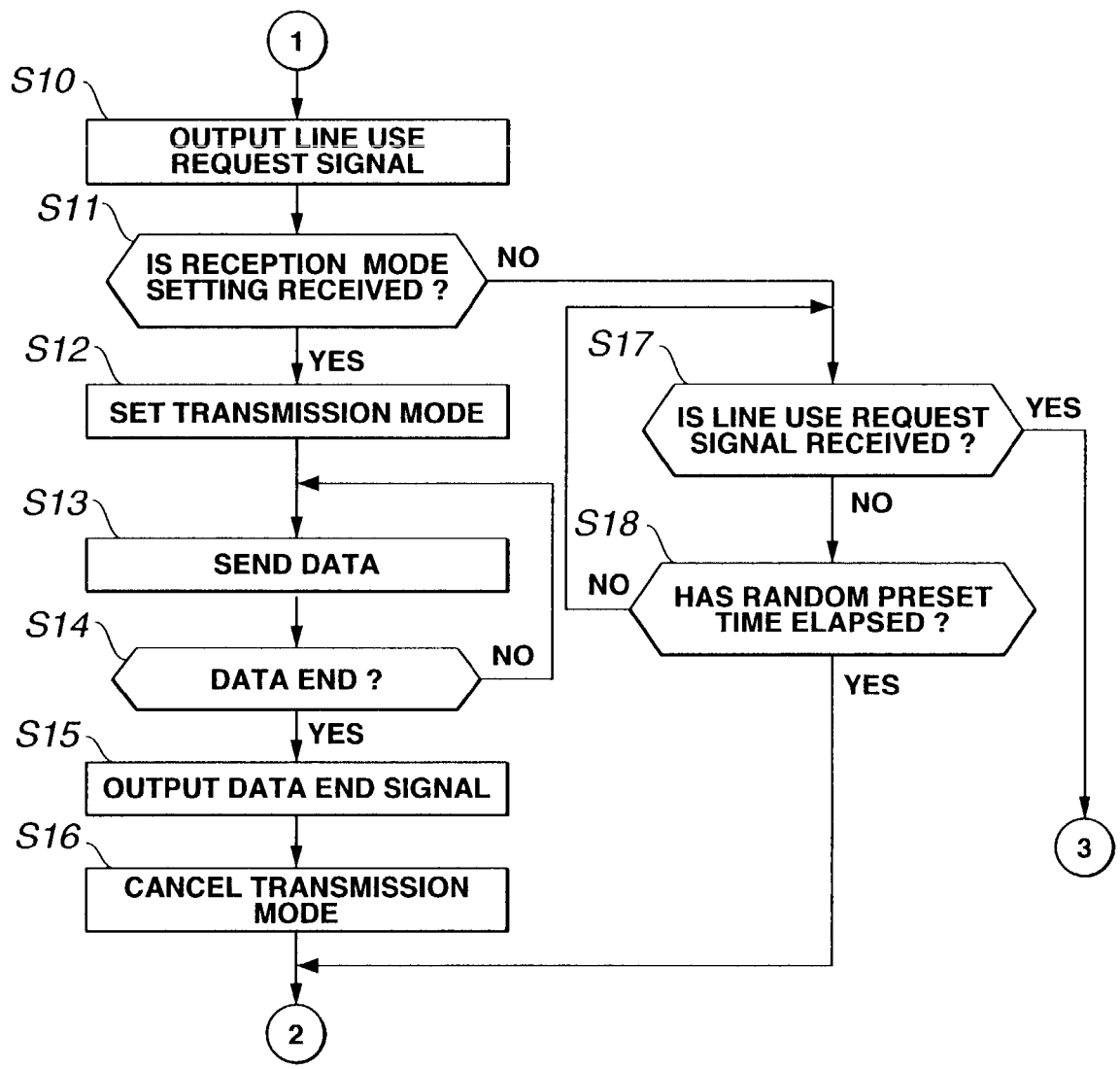
FIG. 8 is a flowchart for illustrating the communication processing in the optical communication system shown in FIG. 5.

If, for example, the amount of the stray light M is 5% and the noise also is 5%, the S/N ratio according to the customarily accepted concept is 10 (=1/(0.05+0.05)), such that, from FIG. 2, the Q-value is 5, so that it becomes difficult to achieve the bit error rate 1E−9.

The S/N ratio in the concept of the present invention is 19 (=(1−0.05)/0.05), such that, from FIG. 2, the Q-value is 9.5. Consequently, the realization of the bit error rate of 1E−12 becomes possible.

Figure 15:
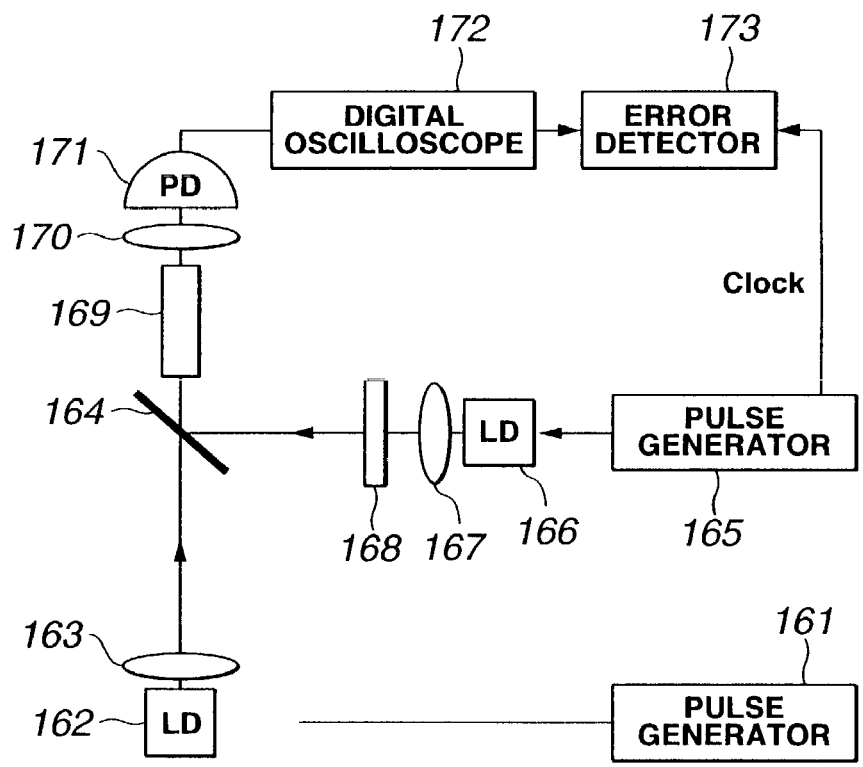
FIG. 15 is a block diagram showing a structure of an experimental device.

The present inventors conducted experiments using a system shown in FIG. 15. As signal components, pulses were generated by a pulse generator 165 to drive a laser diode 166. The laser light radiated from the laser diode 166 is incident through lens 167 and ND filter 168 on a half-mirror 164. The laser light reflected by the half-mirror 164 falls on a multi-mode silicon fiber 169 and propagated therethrough so as to be incident through lens 170 on a photodiode 171.

A pulse generator 165 is used to generate signals serving as stray light components for driving a laser diode 162. The laser light radiated from the laser diode 162 falls through lens 163 on the half mirror 164 so as to be synthesized with the laser light as signal component.

A digital oscilloscope 172 is used to observe changes in light volume received by photodiode 171 and an error detector 173 compares the pulses (clocks) output by a pulse generator 165 with the results observed by the digital oscilloscope 172 to detect an error.

Figure 16:
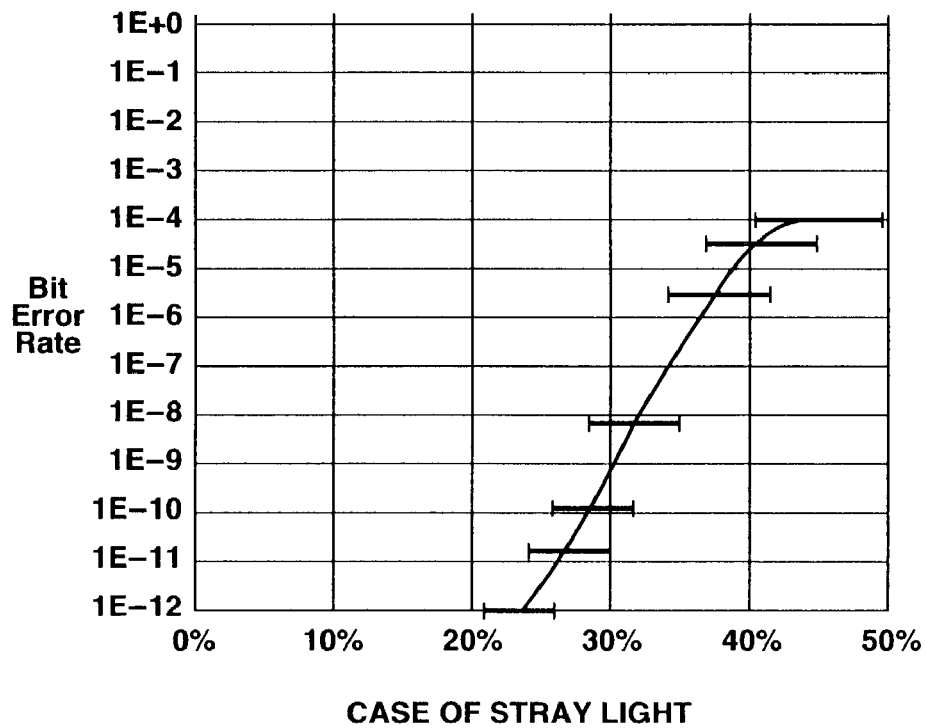
FIG. 16 is a graph showing characteristics obtained by an experiment on the experimental device shown in FIG. 15.

It may be seen from FIG. 16, showing the results of error detection, that the higher the proportion of stray light, the worse becomes the bit error rate.

The proportion of stray light when the bit error rate of 1E-9 is approximately 31%, while the proportion of the stray light when the 1E-12 bit error rate is obtained is approximately 23%.

TABLE 1

Amount of stray light necessary for realizing BER

| BER | 1E-9 (Q = 6) | 1E-12 (Q = 7) |
|---|---|---|
| experimental values | 31% | 23% |
| calculated value 1 | 3% | 2% |
| calculated value 2 | 34% | 23% |

Table 1 shows a calculated value 1 of the bit error rate obtained on calculations based on the conventional equation $$S/N \text{ ratio}=S/(N+N)$$

$$S/N \text{ ratio}=S/(N+N)$$

and a calculated value 2 obtained on calculations based on the equation $$S/N \text{ ratio}=(S-M)/N$$

according to the present invention.

It may be seen that the calculated value differs significantly from the experimental value, whereas the calculated value substantially coincides with the experimental value. This testifies to the correctness of the notion of the present invention that the stray light is to be conceived as signal deterioration rather than as the noise exhibiting the Gaussian distribution.

While e.g. the interface was formerly designed so that the amount of stray light will be lesser than the value of the stray light M $$M=(S/2Q)-N$$

obtained by the equation $2Q=S/(N+N)$, the amount of the stray light is designed, according to the present invention, so as to be lesser than the value obtained by the equation $$M=S-2QN$$

obtained in turn in accordance with the equation $$2Q=(S-M)/N.$$

Stated differently, the interface is designed so that the amount of the stray light M will be in a range represented by the following relation:

$$S-2QN \geq M > (S/2Q)-N.$$

becomes possible with uni-core full-duplex communication. That is, in accordance with the conventional computing method, the Q-value corresponding to the 1E-12 is 7, from FIG. 2, even though the value of the noise N of the Gaussian distribution is 0, so that the value of $M=S/2Q$ is 7% ($=1/(2\times 7)$). On the other hand, if the principle of the present invention is obeyed, the value of $M=S-2Q$ is 30% ($=1-2\times 7\times 0.05$), even though the noise exhibiting the Gaussian distribution is assumed to be 5%. That is, the presence of a corresponding larger amount of the stray light is allowed.

The result is that the designing is facilitated to realize the 1394 bus with the uni-code full-duplex communication.

By way of explaining a more specified instance, the light emitting device 132 may, for example, be a laser diode or LED, the wavelength of which is in the vicinity of 650 nm, while its RIN (relative noise intensity) may be not larger than −115 dB/Hz.

As the light receiving device 136, a PIN photodiode of silicon may be used. As an optical fiber 76, a plastic optical fiber of StepIndex formed by PMMA may be used. If a signal is to be modified with duty 50% by the light emitting driver circuit 131, the amount of transmitted light may be −2.7 dBm to −9.9 dBm in teems of an average power.

With the transmission distance of the optical fiber 76 of 10 m, the light volume loss in this transmission system is assumed to be 5 dB at the maximum, in view of transmission loss, bending loss and end face loss. The amount of reflection at an end face of a communication partner on the optical fiber 76 (amount of reflection at the distal end) and the receipt efficiency are assumed to be 1.4% at the maximum and −3 dB, respectively. In this system, the light volume of the minimum received signal in case of 10 m transmission is −17.9 dBm, as may be seen from the following equation;

$$-17.9 \text{ dBm}=-9.9 \text{ dBm}-5 \text{ dB}-3 \text{ dB}.$$

On the other hand, the stray light at the distal end is maximum when the optical fiber 76 itself is radiating the maximum light volume so that the value of the stray light at the distal end is −34.2 dBm, as may be seen from the following equation:

$$-34.2 \text{ dBm}=-2.7 \text{ dBm}-5 \text{ dB}-18.5 \text{ dB}-5 \text{ dB}-3 \text{ dB}$$

where −18.5 dB denotes the amount of reflection at the distal end equal to 1.4%.

If the amount of stray light at the proximal end is 0.5% of the amount of radiated light at the light emitting device 132, that is −23 dB it is −25.7 dBm as may be seen from the following equation:

$$-25.7 \text{ dBm}=-2.7 \text{ dBm}-23 \text{ dB}.$$

Therefore, the sum of the stray light at the distal end and that at the proximal end is −25.1 dBm.

That is, the light volume of −34.2 dBm from the distal end, calculated as an original value, is $$-34.2 \text{ dB}=10 \log x$$

which may be solved for x to give $$x=3.8 \times 10^{-4}.$$

In similar manner, the light volume of −25.7 dBm from the proximal end, calculated as an original value, is $$-25.7 \text{ dBm}=10 \log x$$

which may be solved for x to give $$x=2.7 \times 10^{-3}=27 \times 10^{-4}$$

From the following equation:

$$3.8 \times 10^{-4}+27 \times 10^{-4}=30.8 \times 10^{-4}$$

the sum of the volumes of the received light at both ends is $30.8 \times 10^{-4}$.

If this value is calculated in dBm, it is −25.1 dBm, from the following equation:

$$10 \log (30.8 \times 10^{-4})=-25.1 \text{ dBm}.$$

The result is that the ratio of the stray light to the signal is −7.2 dB, that is 19%, as may be indicated by the following equation:

−7.2 dB=−25.1 dBm−(−17.9 dBm).

Thus, the 1E−12 but error rate may be realized

Moreover, if the receipt efficiency is −6 dB, the minimum receipt light volume signal amount is −20.9 dBm, as may be seen from the following equation:

−20.9 dBm=−9.9 dBm−5 dB−6 dB.

The stray light at the distal end is −37.2 dBm, as may be seen from the following equation:

−37.2 dBm=−2.7 dBm−5 dB−18.5 dB−5 dB−6 dB.

If the stray light at the proximal end is 0.3% (−25.2 dB) of the volume of the generated light, it is −27.9 dBm, as may be seen from the following equation:

−27.9 dBm=−2.7 dBm−25.2 dB.

The sum of the received light volume at the distal end and at the proximal end is −27.4 dBm.

That is, the light volume of the stray light from the distal end of −37.2 dBm, calculates as the original value, is −37.2 dBm=10 log$x$ which may be solved for x to give $x$=1.9×10$^{−4}$.

Similarly, the light volume of the stray light from the distal end of −27.9 dBm calculated as the original value is 27.9 dBm=10 log$x$ which may be solved for x to give $x$=1.6×10$^{−3}$=16×10$^{−4}$.

From the following equation:

1.9×10$^{−4}$+16×10$^{−4}$=17.9×10$^{−4}$ the sum of the two is 17.9×10$^{−4}$.

If this value is calculated as dBm, it is −27.4 dBm, as may be seen from the following equation:

10 log(17.9×10$^{−4}$)=−27.4 dBm.

The ratio of the stray light to the signal is −6.5 dB, that is 22%, as may be seen from the following equation:

−6.5 dB=−27.4 dBm−(−20.9 dBm).

Here again, a bit error rate of 1E−12 can be realized.

Figure 17:
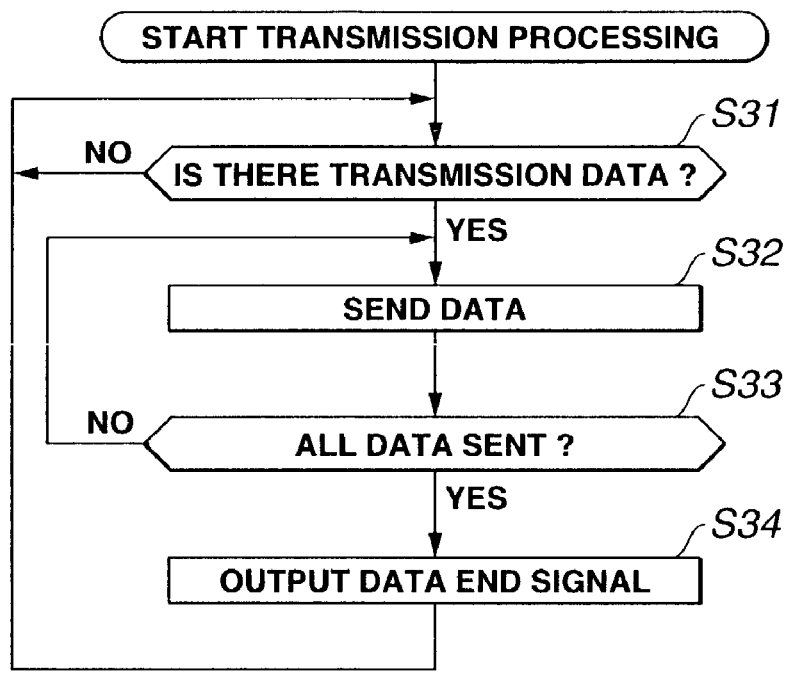
FIG. 17 is a flowchart for illustrating the transmission processing of an interface shown in FIG. 10.

Referring to the flowchart of FIG. 17, the transmission processing of an interface shown in FIG. 10 is explained. First, at step S31, the control circuit 124 checks whether or not transmission data exist. If it is verified that there exist no transmission data, the control circuit 124 is at a standby state until transmission data is produced.

If, at step S31, it is verified that these exist transmission data, processing transfers to step S32 where the control circuit 124 executes the processing of sending the data.

The control circuit 124 then outputs transmission data to the transmission circuit 121, which then modulates the transmission data in accordance with a preset system to send the modulated data to the light emitting driver circuit 131 of the transceiver circuit 122. The light emitting driver circuit 131 drives the light emitting device 132 based on the transmission data input from the transmission circuit 121. As a result, the light emitting device 132 generates light corresponding to the transmission data.

This light is incident through a coupling lens 142 to a total reflection surface 143A of a light path raising mirror 143 where the incident light is totally reflected so as to be introduced from the end face 76A into the inside of the optical fiber 76 for transmission to the equipment of the communication partner.

At step S33, the control circuit 124 verifies whether or not the totality of data have been received. If there is any data not as yet transmitted, processing reverts to step S32 to repeat the similar processing.

If it is verified at step S33 that the totality of data have been transmitted, processing transfers to step S34 where the control circuit 124 outputs a data end signal which is sent to the communication partner as routine communication data. On receipt of the data end signal, the communication partner is able to detect the end of data transmitted. Then, processing reverts to step S31 to repeat subsequent processing.

Figure 18:
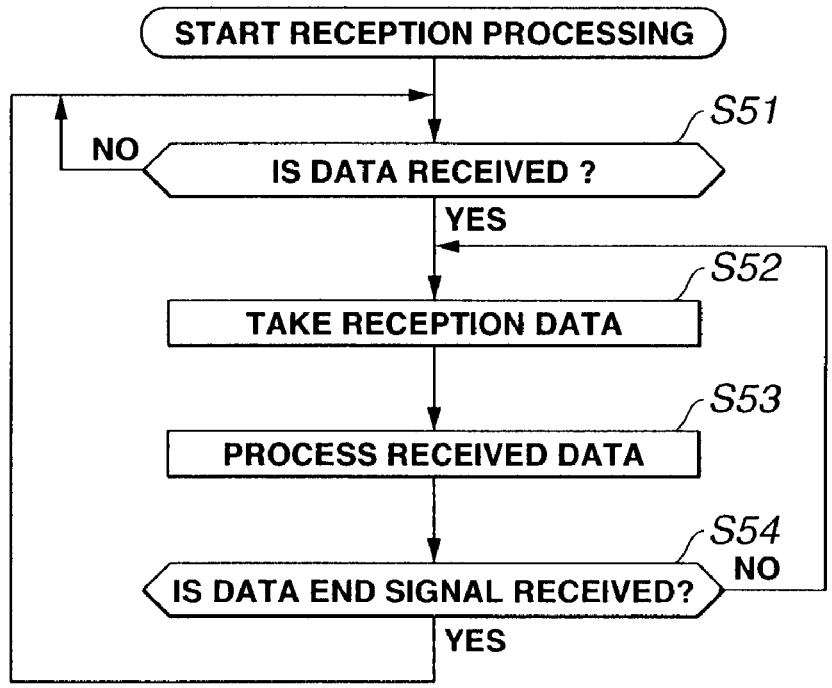
FIG. 18 is a flowchart for illustrating the transmission processing of an interface shown in FIG. 10.

Referring to the flowchart of FIG. 18, the reception processing is explained. At step S51, the control circuit 124 verifies whether or not the data has been received. If the data has not been received, the control circuit 124 is in a stand-by state until the data is received. If it has been verified at step S51 that the data has been received, processing transfers to step S52 where the control circuit 124 undertakes the processing to take the reception data.

That is, the light propagated on the optical fiber 76 is radiated from the end face 76A to fall on the face 136A of the light receiving device 136 on the semiconductor substrate 141. The light receiving device 136 outputs a signal corresponding to the volume of the incident light. This signal is converted by the preamplifier 137 from the current to the voltage and sent to the waveform shaping/binary coding circuit 138. This waveform shaping/binary coding circuit 138 waveforms shapes and binary-codes the input voltage signal to route the resulting signal to the receipt circuit 123. The receipt circuit 123 demodulates the received data for storage in an enclosed memory.

Then, processing transfers to step S53 where the control circuit 124 undertakes to process the received data. The control circuit 124 controls the receipt circuit 123 to receive data to process the stored data. The receipt circuit 123 corrects the received data for errors to route the received data to the control circuit 124.

Then, processing transfers to step S54 where the control circuit 124 checks whether or not the data end signal has been received. If the data end signal has not been received, processing reverts to step S52 to repeat subsequent processing.

If it is verified at step S54 that the data end signal has been received, the control circuit 124 deems that the processing of data transmission from the communication partner has come to a close to terminate the receipt processing. Then, processing reverts to step S51 to repeat the subsequent processing.

The control circuit 124 undertakes to execute the transmission processing shown in FIG. 17 and the receipt processing shown in FIG. 18 independently of each other. In other words, it allows for receipt processing as transmission processing is continued, while allowing for transmission processing as receipt processing is continued. By so doing, the control circuit 124 is able to transmit and receive data at an optional timing.

In this manner, the equipment connected to the optical fiber 76 is able to transmit and receive data promptly.

Although the present invention is applied to the 1394 bus the present invention may be applied to other optical communication systems exploiting an optical fiber. may be applied to other optical communication systems exploiting an optical fiber.

INDUSTRIAL APPLICABILITY

According to the present invention, in which the value of the light volume M in the light reception means is set such as to satisfy the following equation:

$$S-2QN \geq M > S/2Q-N$$

it is possible to send the light for transmission and the light for receipt of substantially the same wavelength simultaneously on the routine cable to effect communication bidirectionally. As a result, both the weight and the production cost can be reduced as compared with an instance in which two cables are used.

Moreover, according to the present invention, in which, when the light for transmission is emitted by light emitting means and propagated over a cable, signal processing is allowed for the light for receipt received by light receiving means, whereas, when the light for receipt propagated over a cable is received by light receiving means, signal processing is allowed for the light for transmission emitted by light emitting means, it is possible to have the light for transmission and the light for receipt propagated simultaneously through a sole cable to perform bidirectional communication.

The invention claimed is:

1. An optical communication apparatus in which light for transmission and light for receipt are propagated simultaneously over a sole cable to effect bidirectional communication, comprising:
   light emitting means for emitting said light for transmission;
   light receipt means for receiving said light; and
   light guide means for guiding said light for transmission over said cable and for guiding said light to said light receipt means, wherein
   a value of a light volume M of stray light generated with respect to said light receipt means satisfies the following relationship:

$$S-2QN \geq M > S/2Q-N$$

Where Q is the value of a Q-value representing communication quality as required, S is light volume of a received signal from a communication partner and N is a sum total of a Gaussian noise.

2. The optical communication apparatus according to claim 1 wherein a ratio S/M, where S is the light volume of the received signal and M is the light volume of the stray light is 7% to 30%.

3. The optical communication apparatus according to claim 1 wherein a transmission speed in said optical communication is not lower than 100 Mbps.

4. The optical communication apparatus according to claim 1 wherein said cable is a plastic optical fiber.

5. The optical communication apparatus according to claim 1 wherein the sum of light volumes of the reflected light from the communication partner is 0.7% to 3.0% of the volume of the received light in said communication partner.

6. An optical communication method, comprising the steps of: emitting light for transmission from a light emitting means, receiving light at a light receipt means, and guiding said light for transmission and said light for receipt over a sole cable, said light for transmission and said light for receipt of substantially the same wavelength being propagated substantially simultaneously by said cable to effect bidirectional communication; wherein
   value of a light volume M of stray light generated with respect to said light receipt means satisfies the following relationship:

$$S-2QN \geq M > S/2Q-N$$

Where Q is the value of a Q-value representing communication quality as required, S is light volume of a received signal from a communication partner and N is a sum total of a Gaussian noise.

* * * * *

UNITED STATES PATENT AND TRADEMARK OFFICE
CERTIFICATE OF CORRECTION

PATENT NO. : 7,072,583 B2
APPLICATION NO. : 10/019332
DATED : July 4, 2006
INVENTOR(S) : Kuninori Shino et al.

It is certified that error appears in the above-identified patent and that said Letters Patent is hereby corrected as shown below:

Column 7, Line 46 insert a --,-- after the word LED and before the word falls.

Column 10, Line 13 replace the word "teems" with the word --terms--.

Column 10, Line 53 replace "log $x$" with --logx--.

Signed and Sealed this

Twenty-fourth Day of October, 2006

JON W. DUDAS
*Director of the United States Patent and Trademark Office*